United States Patent
Weber et al.

(10) Patent No.: US 6,597,580 B2
(45) Date of Patent: Jul. 22, 2003

(54) FLEXIBLE SHIELDED CIRCUIT BOARD INTERFACE

(75) Inventors: Leonard M. Weber, Bodega Bay, CA (US); Terrence R. Noe, Sebastopo, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/999,492

(22) Filed: Nov. 30, 2001

(65) Prior Publication Data

US 2003/0103322 A1 Jun. 5, 2003

(51) Int. Cl.⁷ .................................................. H05K 1/00
(52) U.S. Cl. ............................ 361/750; 439/63; 439/77
(58) Field of Search ................................. 361/749, 750, 361/751, 789, 816, 818; 174/34, 35 R, 35 C; 439/63, 67, 77

(56) References Cited

U.S. PATENT DOCUMENTS

| | | | | |
|---|---|---|---|---|
| 4,636,015 A | * | 1/1987 | Ford, Jr. ......................... 439/95 |
| 5,244,410 A | * | 9/1993 | Demus et al. ............... 439/497 |
| 5,982,626 A | * | 11/1999 | Kodama ....................... 361/749 |
| 6,344,978 B1 | * | 2/2002 | Komiya ........................ 361/816 |
| 6,384,890 B1 | * | 5/2002 | Takiar et al. ................. 349/150 |

* cited by examiner

Primary Examiner—Lynn Feild
Assistant Examiner—Thanh-Tam Le
(74) Attorney, Agent, or Firm—John L. Imperato

(57) ABSTRACT

A shielded serpentine extension, internal signal path and receptor result in a flexible shielded interface for a circuit board that can be formed consistent with efficient circuit board fabrication processes. The shielded serpentine extension, continuous with the circuit board, has a receptor at an end that is distal from the circuit board. The receptor has a signal contact and a shield contact adapted to receive a surface mount connector. A signal path internal to the serpentine extension couples the signal contact of the receptor to the circuit board. The serpentine extension has shielding disposed about the signal path that couples the shield contact to the circuit board.

20 Claims, 7 Drawing Sheets

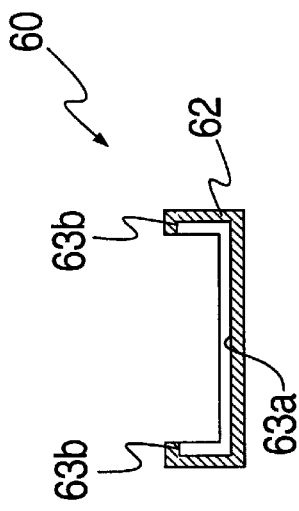
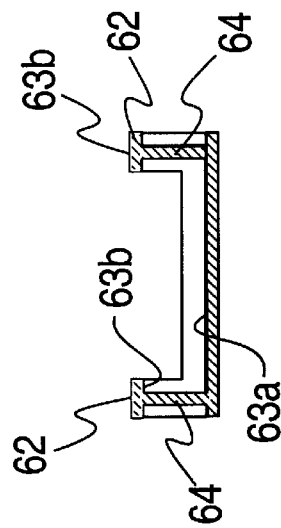
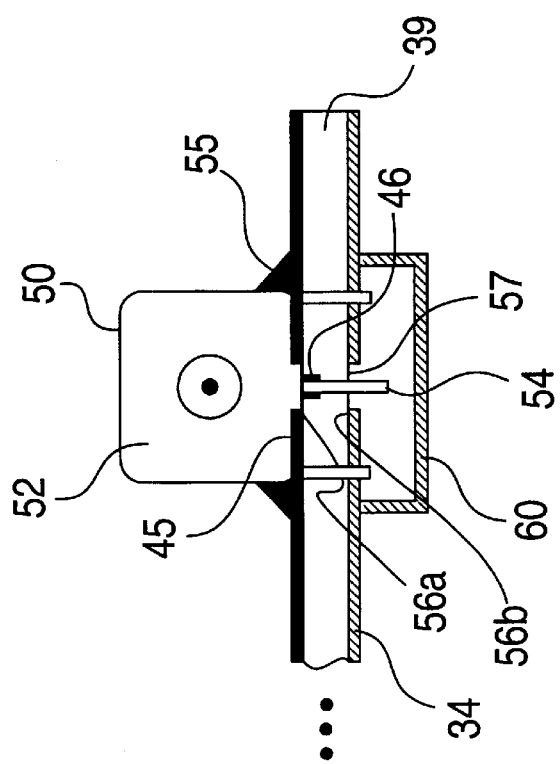
FIGURE 6A
FIGURE 6B
FIGURE 5

FLEXIBLE SHIELDED CIRCUIT BOARD INTERFACE

BACKGROUND OF THE INVENTION

Many types of electronic instruments have coaxial panel connectors that are used to couple signals to and from the electronic instrument. These electronic instruments also have an internal interface that couples signals between the panel connectors and circuit boards that are internal to the instrument. Coaxial cable, such as semi-rigid metal cable, is electrically shielded and has suitable mechanical characteristics for the interface between the panel connector and the internal circuit boards. However, the coaxial cable increases the manufacturing cost of the electronic instrument in which the coaxial cable is included, which can place the electronic instrument at a disadvantage in a competitive marketplace. Accordingly, there is a need for an electrically shielded interface for a circuit board that has suitable mechanical characteristics and that is not likely to increase the manufacturing cost of the electronic instrument in which it is included. This need is met by a flexible shielded circuit board interface constructed according to the embodiment of the present invention.

SUMMARY OF THE INVENTION

According to the embodiment of the present invention, a shielded serpentine extension from a circuit board provides a flexible interface to the circuit board that is electrically shielded. The serpentine extension has a receptor at an end that is distal from the circuit board. The receptor has a signal contact and a shield contact adapted to receive a surface mount connector. A signal path internal to the serpentine extension couples the signal contact of the receptor to the circuit board, while shielding disposed about the internal signal path of the serpentine extension couples the shield contact to the circuit board. The shielded serpentine extension, internal signal path and receptor result in a flexible shielded interface for a circuit board that can be formed consistent with efficient circuit board fabrication processes. This enables the flexible shielded circuit board interface to have a low manufacturing cost.

BRIEF DESCRIPTION OF THE DRAWINGS

FIG. 5 shows the flexible shielded circuit board interface shown in FIGS. 3A–3F, with an optionally included surface mount connector.

FIGS. 6A–6B show a conductive cap optionally included in the flexible shielded circuit board interface constructed according to the embodiment of the present invention.

DETAILED DESCRIPTION OF THE EMBODIMENT

Figure 1:
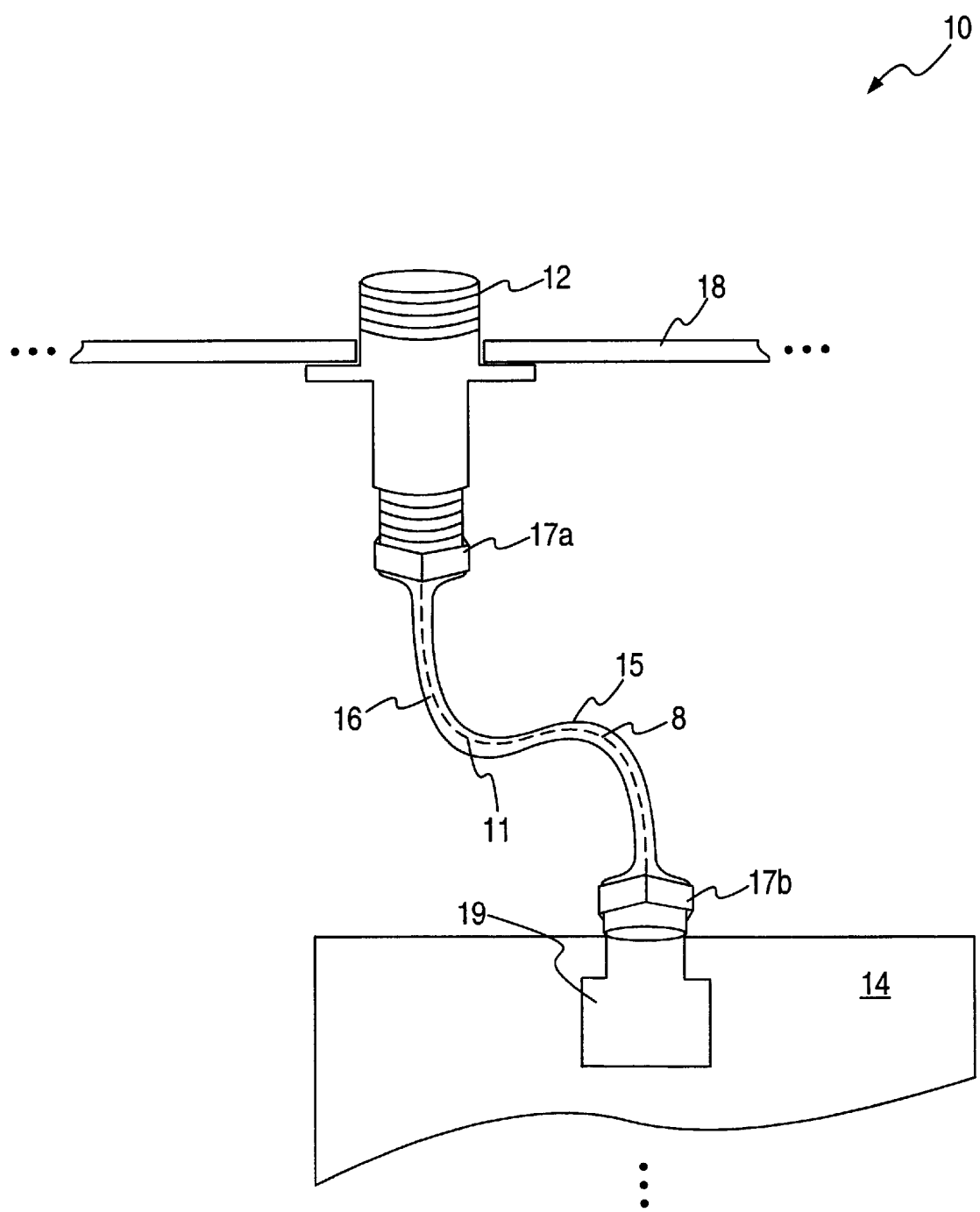
FIG. 1 shows a prior art coaxial cable providing an interface for coupling signals between a panel connector and a circuit board.

The prior art coaxial cable 8 shown in FIG. 1 provides an interface 10 for coupling signals 11 between a panel connector 12 and a circuit board 14. The coaxial cable 8 has an external cylindrical shield 15 that is metal, and a center conductor 16 that is also metal. A flexible dielectric is interposed between the center conductor 16 and the external cylindrical shield 15.

The coaxial cable 8 has coaxial connectors 17a, 17b soldered at each end. A first coaxial connector 17a mates with the panel connector 12 of an electronic instrument 18. A second coaxial connector 17b mates with a connector 19 on the circuit board 14. The coaxial cable 8 has a serpentine shape to increase flexibility of the interface 10 between the panel connector 12 and the circuit board 14 to aid in the installation of the coaxial cable 8 and to provide absorption of shocks and vibrations imposed on the panel connector 12 of the electronic instrument 18. This type of prior art interface 10 has favorable electrical and mechanical characteristics, but relies on the coaxial cable 8 and the pair of coaxial connectors 17a, 17b, thereby adding to the manufacturing cost of the electronic instrument 18 in which this type of interface 10 is included.

Figure 2:
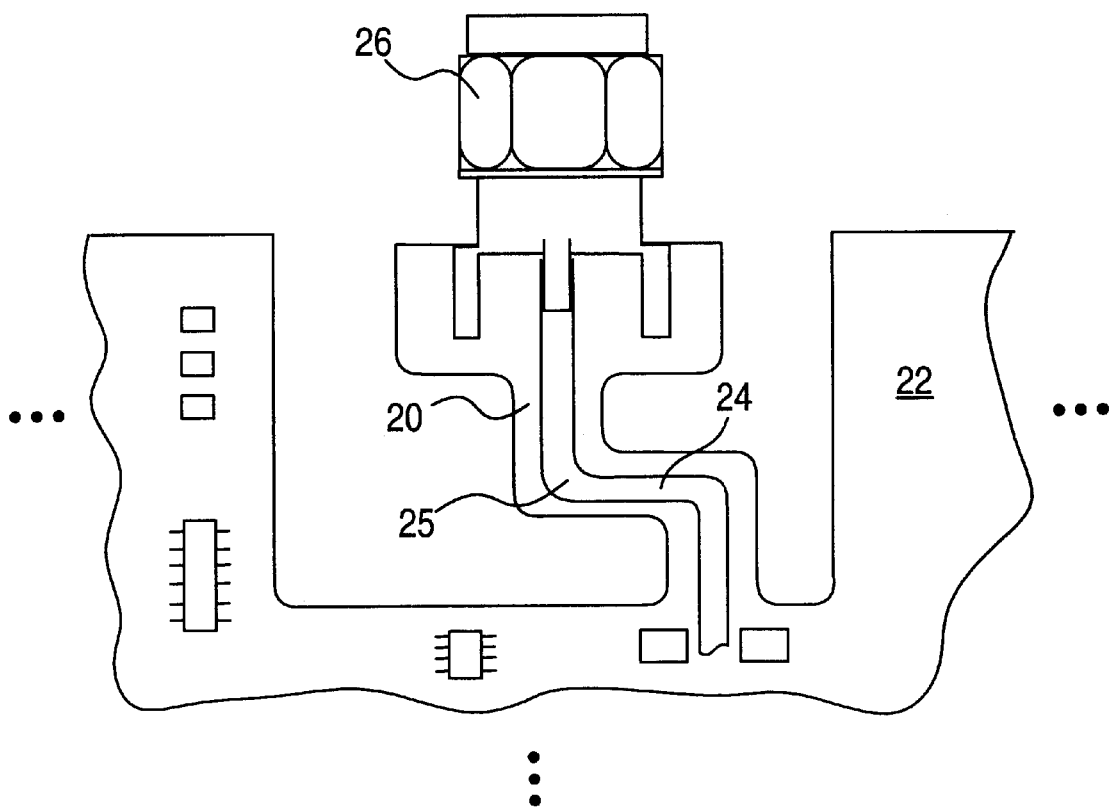
FIG. 2 shows a prior art unshielded interface.

FIG. 2 shows a prior art unshielded interface 20. The unshielded interface 20 has a serpentine shape that has suitable mechanical flexibility for an interface between a panel connector (not shown) and a circuit board 22. This prior art unshielded interface 20, included in commercial products such as the model E6450A Digital PCS Receiver, from AGILENT TECHNOLOGIES, INC, of Palo Alto, Calif., also has low manufacturing cost. However, while having mechanical flexibility and low manufacturing cost, a signal path 24 which is on a surface of this prior art unshielded interface 20 does not provide electrical shielding for signals 25 coupled between an edge launch 26 and the circuit board 22.

Figure 3A:
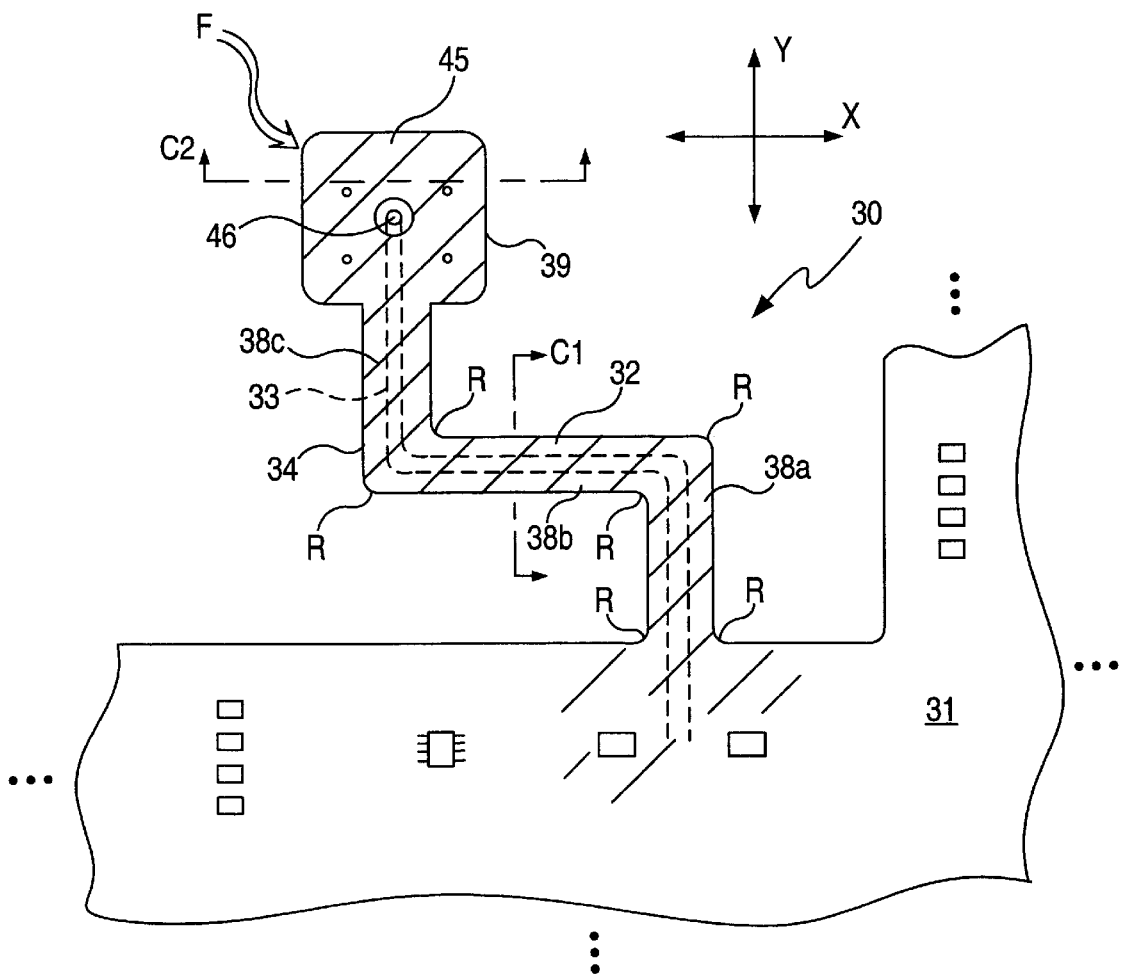
FIGS. 3A–3F show a flexible shielded circuit board interface constructed according to the embodiment of the present invention.

FIG. 3A shows a flexible shielded interface 30 for a circuit board 31, constructed according to the embodiment of the present invention. The flexible shielded interface 30 has mechanical flexibility and low manufacturing cost as does the prior art unshielded interface 20 shown in FIG. 2. In addition, the flexible shielded interface 30 also provides electrical shielding as does the prior art coaxial cable 8 shown in FIG. 1.

Figure 3C:
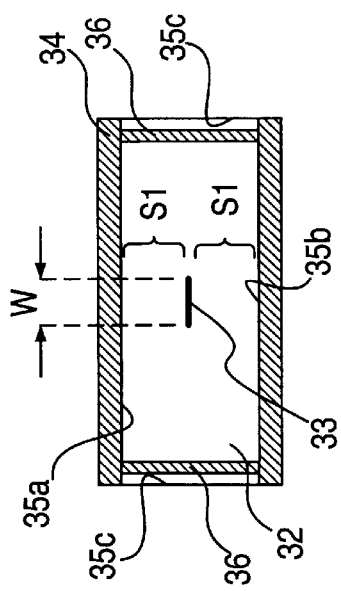
Figure 3E:
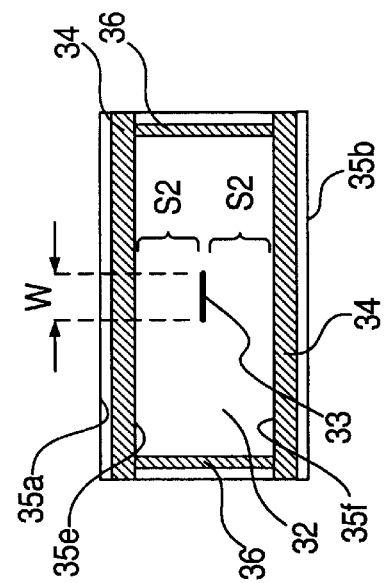
Figure 3B:
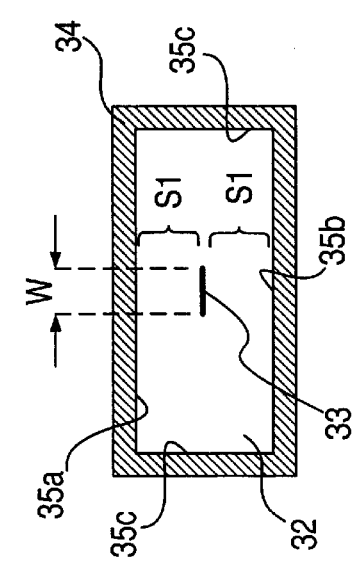

The flexible shielded interface 30 includes a serpentine extension 32 having an internal signal path 33 and shielding 34 disposed about the internal signal path 33, as shown in the detailed view of FIG. 3B, taken along cross-section C1. The internal signal path 33 is electrically conductive and is formed using additive circuit board fabrication processes, such as screening, plating or depositing of conductive paste, metal or other electrically conductive material. Alternatively, the internal signal path 33 is formed using subtractive circuit board fabrication processes, such as milling or etching of electrically conductive material already present on the circuit board 31. Any other circuit board fabrication process suitable for establishing electrically conductive traces that are internal to a circuit board 31 are alternatively used to form the internal signal path 33.

Figure 3D:
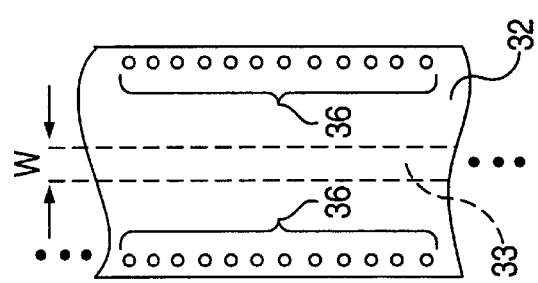

The shielding 34 of the flexible shielded interface 30 is also electrically conductive and is disposed about the internal signal path 33 by screening, plating or depositing conductive paste, metal or other electrically conductive material on each of a top surface 35a, a bottom surface 35b, and side surfaces 35c of the serpentine extension 32 as shown in FIG. 3B. Alternatively, the shielding 34 is disposed about the internal signal path 33 by screening, plating, or depositing the electrically conductive material on the top surface 35a and the bottom surface 35b of the serpentine extension 32, and forming conductive vias 36 that couple the top surface 35a and the bottom surface 35b as shown in the detailed cross-sectional view of FIG. 3C and the detailed top view of FIG. 3D. While the shielding is shown on the top surface 35a and the bottom surface 35b as external surfaces of the serpentine extension 32, the shielding 34 is alternatively disposed about the internal signal path 33 on an internal upper layer 35e and an internal lower layer 35f of the serpentine extension 32 as shown in the cross-section of FIG. 3E.

Characteristic impedance of the flexible shielded interface 30 depends on a width W of the internal signal path 33, the type of substrate used to form the circuit board 31 and serpentine extension 32, and a spacing between the internal signal path 33 and the shielding 34. A spacing S1 between the internal signal path 33 and the shielding 34 results when the shielding 34 is on the top surface 35a and bottom surface 35b as in FIGS. 3B–3C, while a spacing S2 results when the shielding 34 is on the internal upper layer 35e and the internal lower layer 35f of the serpentine extension 32 as in FIG. 3E. As an example, a characteristic impedance of 50 ohms results for a R04350 type of substrate, with the width W of the internal signal path 33 being 0.019 inches and with the spacing S1 being 0.0185 inches. In this example, the R04350 substrate is a multi-layer woven glass and ceramic loaded thermoset plastic resin, available from Rogers Corporation of Chandler, Ariz. However, fiberglass/epoxy mixtures, GETEK available from GENERAL ELECTRIC of Coshocton, Ohio, FR-4, and other types of substrates suitable for providing circuit boards 31 with internal signal paths 33 and shielding 34 are alternatively used.

Figure 3F:
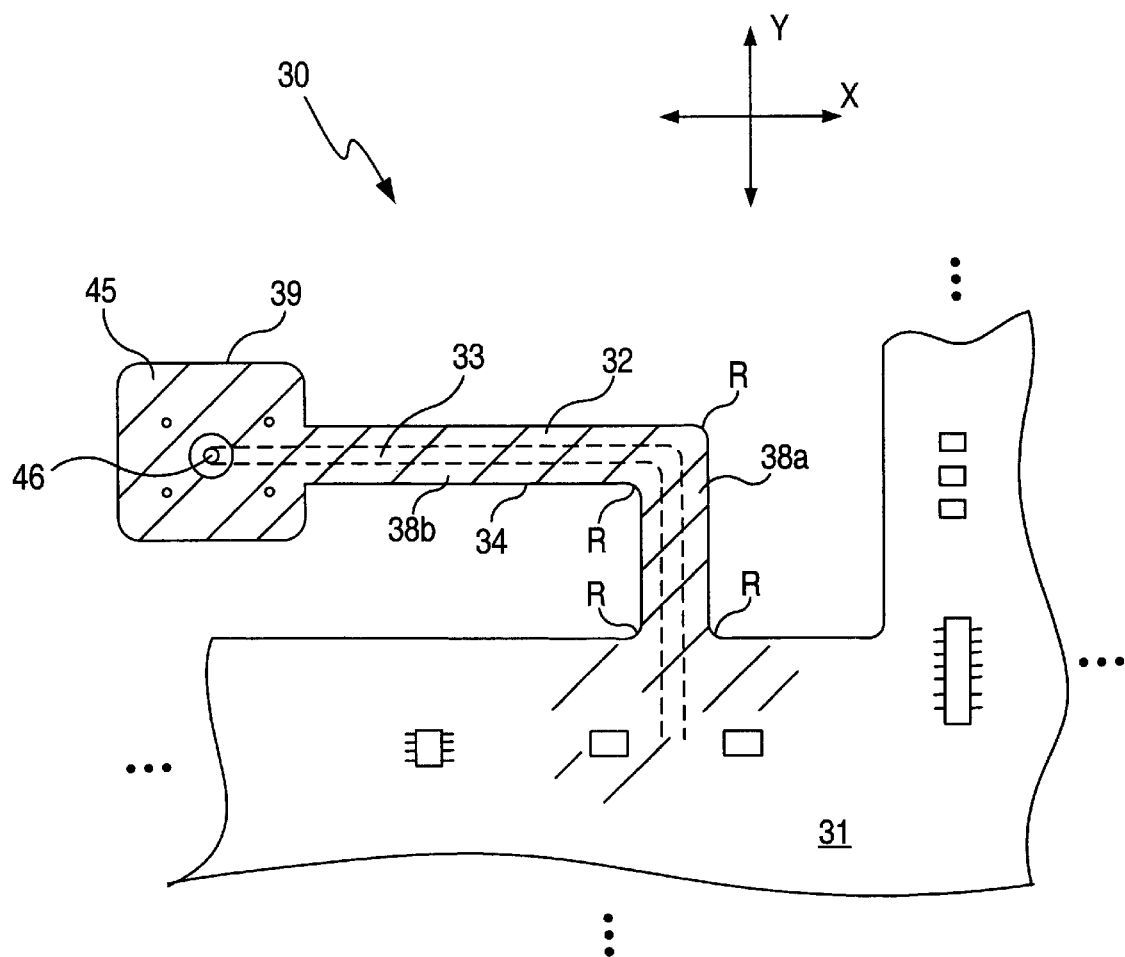

The serpentine extension 32 is typically routed, milled or stamped from a circuit board panel or substrate (not shown) so that the serpentine extension 32 is continuous with the circuit board 31. However, the serpentine extension 32 is alternatively formed by other suitable processes that are compatible with shaping circuit boards 31 from a substrate. Radii R shown in FIGS. 3A and 3F are optionally formed in the serpentine extension 32 to inhibit development of stress cracks and fractures at transition points of the serpentine extension 32 that may otherwise result from flexure of the serpentine extension 32. As an example, suitable radii R of 0.0625 inches result when a correspondingly sized router bit is used to form the serpentine extension 32.

The serpentine extension 32 provides mechanical flexibility to the flexible shielded interface 30, enabling the flexible shielded interface 30 to flex or deflect in response to forces F that are applied to the flexible shielded interface 30, as indicated in FIG. 3A. For example, forces F imposed on the flexible shielded interface 30 during connection of the flexible shielded interface 30 to a panel connector 42 of an electronic instrument 44 (shown in FIG. 4) causes sufficient deflection of the flexible shielded interface 30 to enable the flexible shielded interface 30 to be aligned with, and mated to, the panel connector 42. Flexibility of the flexible shielded interface 30 also enables mechanical shocks and vibrations imposed on the panel connector 42 or the chassis of the electronic instrument 44 to be absorbed by flexure or deflection of the flexible shielded interface 30 rather than being transferred directly to the circuit board 31. This absorption by the flexible shielded interface 30 prevents the mechanical shocks and vibrations imposed on the panel connector 44 from damaging the circuit board 31.

While the serpentine extension 32 is shown in FIG. 3A as having three segments 38a–38c, the serpentine extension 32 is suitably formed having at least two cascaded segments 38a, 38b as shown in FIG. 3F. Additional segments are optionally cascaded with the two cascaded segments 38a, 38b to provide additional flexibility to the serpentine extension 32. However, insertion loss of the flexible shielded interface 30 generally increases as the total length of the internal signal path 33 increases. Trade-offs between flexibility and insertion loss are typically made in choosing the number of cascaded segments.

Since the serpentine extension 32 is continuous with the circuit board 31, the cascaded segments are typically coplanar with the circuit board 31. The first segment 38a of the serpentine extension 32 has a first end that is continuous with the circuit board 31. The first segment 38a is flexible along a first axis X. The second segment 38b of the serpentine extension 32 is continuous with a second end of the first segment 38a that is distal from the first end of the first segment 38a. The second segment 38b has a flexure component along a second axis Y that is orthogonal to the first axis X. The third cascaded segment 38c included in the flexible shielded interface 30 of FIG. 3A also provides flexibility along the X axis. In addition to being flexible along the first axis X and the second axis Y, the serpentine extension 32 is flexible along a third axis (not shown) that is orthogonal to the first axis X and the second axis Y, due to inherent flexibility of the substrate from which the circuit board 31 and the serpentine extension 32 are formed. The cascaded segments 38a–38c included in the serpentine interface 32 are each shown to have a rectangular shape and an orthogonal orientation. However, curved cascaded segments or cascaded segments having other shapes and orientations that provide a sufficient amount of flexibility along the axes X, Y are alternatively included in the serpentine extension 32.

The serpentine extension 32 has a receptor 39 at an end that is distal from the circuit board 31. In the example where the serpentine extension 32 has two cascaded segments 38a, 38b, the receptor 39 is at a second end of the second segment 38b. In the example where the serpentine extension 32 has three cascaded segments 38a–38c, the receptor 39 is at an end of the third segment 38c that is distal from the circuit board 31. The receptor 39 has a shield contact 45 on a first surface for receiving a surface mount connector 50 (shown in FIG. 5). The receptor 39 also has a signal contact 46. The internal signal path 33 of the serpentine extension 32 couples the signal contact 46 of the receptor 39 to the circuit board 31. The shielding 34 disposed about the internal signal path 33 couples the shield contact 45 of the receptor 39 to the circuit board 31.

FIG. 5 shows a detailed view of the flexible shielded interface 30 taken along cross-section C2 (shown in FIG. 3A), with an optionally included surface mount connector 50. The surface mount connector 50 in this example is a thru-hole SMA connector that has a body 52 affixed to the shield contact 45 and a center conductor 54 coupled to the signal contact 46. Typically, the body 52 of the surface mount connector 50 is affixed using solder, conductive epoxy, or other means compatible with circuit board fabrication processes. Fixing of the surface mount connector 50 to the shield contact 45 is typically indicated by presence of a conductive fillet 55 between the body 52 and the shield contact 45.

Many types of surface mount connectors 50, including SMA, SMC, BNC connectors have the center conductor 54 extending from the first surface 56a of the receptor 39 and protrudes through the receptor 39 to a second surface 56b of the receptor 39 that is opposite the first surface 56a. A relief 57 provided in the shielding 34 on the second surface 56b of the receptor 39 prevents shorting of the center conductor 54 to the shielding 34. To provide electrical shielding for the protruding center conductor 54 of the surface mount connector 50, the shielding 34 optionally includes a conductive cap 60 affixed to the shielding 34 on the second surface 56b of the receptor 39 so that the protruding center conductor 54 is enclosed by the conductive cap 60. The conductive cap 60 is affixed using solder, conductive epoxy or other means compatible with circuit board fabrication processes.

The conductive cap 60 is milled, stamped, routed, or otherwise formed from a substrate of the type-used to form the serpentine extension 32 and circuit board 31. The conductive cap 60 has an electrically conductive coating 62 as shown in FIGS. 6A–6B. The electrically conductive coating 62 shown in FIG. 6A is continuous from a back surface 63a of the conductive cap 60 to a contact surface 63b of the conductive cap 60. As an alternative, the electrically conductive coating 62 in FIG. 6B is on the back surface 63a and on the contact surface 63b, with conductive vias 64 that couple the electrically conductive coating 62 on the back surface 63a to the electrically conductive coating 62 on the contact surface 63b. The conductive cap 60 is alternatively, milled, machined, molded, or otherwise formed from metal or other electrically conductive material.

Figure 4:
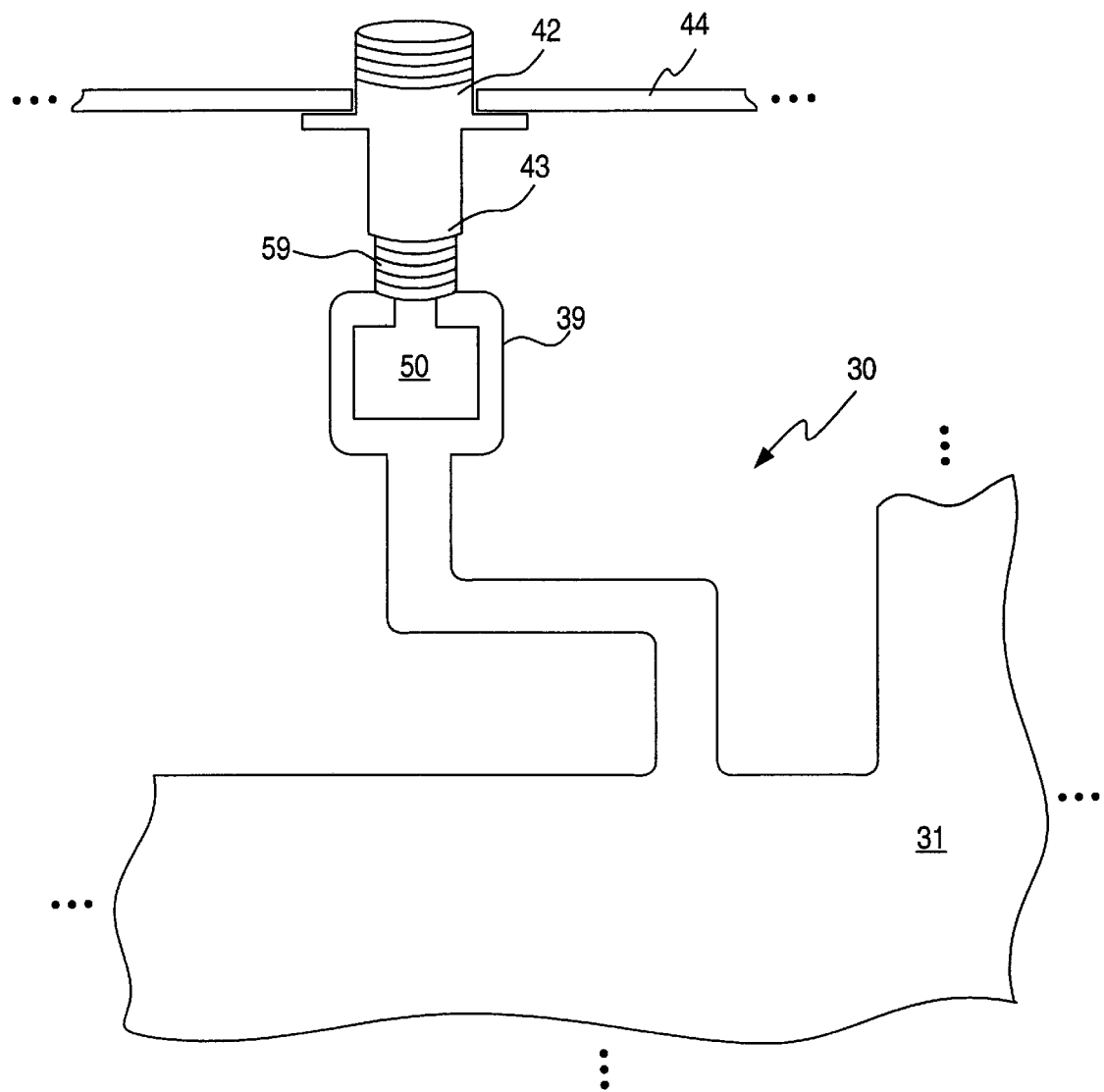
FIG. 4 shows the flexible shielded circuit board interface coupled to a panel connector of an electronic instrument.

The flexible shielded interface 30 is shown coupled to the panel connector 42 of the electronic instrument 44 in FIG. 4. The electronic instrument 44 is typically a commercial test instrument, consumer instrument, military instrument or medical instrument. The panel connector 42 is mounted to a chassis of the electronic instrument 44 and has a threaded internal port 43. A threaded port 59 of the surface mount connector 50 of the flexible shielded interface 30 mates with the threaded internal port 43 of the panel connector 42. The circuit board 31, continuous with the flexible shielded interface 30, is typically mounted internally to the electronic instrument 44.

While the embodiment of the present invention has been illustrated in detail, it should be apparent that modifications and adaptations to this embodiment may occur to one skilled in the art without departing from the scope of the present invention as set forth in the following claims.

What is claimed is:

1. An interface for a circuit board, comprising:
    a serpentine extension continuous with the circuit board flexible in response to an applied force, the serpentine extension having a receptor at an end that is distal from the circuit board, the receptor having a signal contact and a shield contact on a first surface adapted to receive a surface mount connector, the serpentine extension having an internal signal path coupling the signal contact of the receptor to the circuit board and having shielding disposed about the signal path that couples the shield contact to the circuit board.

2. The interface of claim 1 wherein the serpentine extension includes at least two cascaded segments.

3. The interface of claim 2 wherein at least two of the at least two cascaded segments are orthogonal.

4. The interface of claim 1 further comprising the surface mount connector having a body affixed to the shield contact and a having a center conductor coupled to the signal contact.

5. The interface of claim 2 further comprising the surface mount connector having a body affixed to the shield contact and a having a center conductor coupled to the signal contact.

6. The interface of claim 3 further comprising the surface mount connector having a body affixed to the shield contact and a having a center conductor coupled to the signal contact.

7. The interface of claim 4 wherein the shield further includes a conductive cap at the end of serpentine extension that is distal from the circuit board, affixed to a second surface that is opposite to the first surface of the receptor.

8. The interface of claim 5 wherein the shield further includes a conductive cap at the end of serpentine extension that is distal from the circuit board, affixed to a second surface that is opposite to the first surface of the receptor.

9. The interface of claim 6 wherein the shield further includes a conductive cap at the end of serpentine extension that is distal from the circuit board, affixed to a second surface that is opposite to the first surface of the receptor.

10. The interface of claim 4 wherein the surface mount connector is mated to a panel connector of an electronic instrument.

11. The interface of claim 5 wherein the surface mount connector is mated to a panel connector of an electronic instrument.

12. The interface of claim 7 wherein the surface mount connector is mated to a panel connector of an electronic instrument.

13. An interface for a circuit board, comprising:
    at least two cascaded segments that are coplanar with the circuit board, a first segment of the at least two cascaded segments extending from the circuit board and having an end continuous with the circuit board, the first segment flexible along a first axis;
    a receptor at an end of a last segment of the at least two cascaded segments that is distal from the circuit board, having a signal contact and a shield contact on a first surface of the second segment adapted to receive a surface mount connector;
    a signal path internal to the at least two cascaded segment, coupling the signal contact of the receptor to the circuit board; and
    a shield disposed about the signal path of the at least two cascaded segments, coupling the shield contact to the circuit board.

14. The interface of claim 13 wherein at least one segment of the at least two cascaded segments has a flexure component along a second axis that is orthogonal to the first axis.

15. The interface of claim 13 further comprising a surface mount connector having a body affixed to the shield contact and a having a center conductor coupled to the signal contact.

16. The interface of claim 14 further comprising a surface mount connector having a body affixed to the shield contact and a having a center conductor coupled to the signal contact.

17. The interface of claim 15 wherein the shield further includes a conductive cap affixed to a second surface of the receptor that is opposite to the first surface of the receptor.

18. The interface of claim 16 wherein the shield further includes a conductive cap affixed to a second surface of the receptor that is opposite to the first surface of the receptor.

19. The interface of claim 13 wherein the surface mount connector is mated to a panel connector of an instrument.

20. The interface of claim 15 wherein the surface mount connector is mated to a panel connector of an instrument.

* * * * *